US010305430B2

(12) United States Patent
Liu

(10) Patent No.: US 10,305,430 B2
(45) Date of Patent: May 28, 2019

(54) POWER CONTROL METHOD, DEVICE AND COMMUNICATION TERMINAL FOR IMPROVING POWER AMPLIFIER SWITCH SPECTRUM

(71) Applicant: BEIJING VANCHIP TECHNOLOGIES CO., LTD., Beijing (CN)

(72) Inventor: Xida Liu, Beijing (CN)

(73) Assignee: BEIJING VANCHIP TECHNOLOGIES CO., LTD., Beijing (CN)

( * ) Notice: Subject to any disclaimer, the term of this patent is extended or adjusted under 35 U.S.C. 154(b) by 0 days.

(21) Appl. No.: 15/528,409

(22) PCT Filed: Nov. 20, 2015

(86) PCT No.: PCT/CN2015/095228
§ 371 (c)(1),
(2) Date: May 19, 2017

(87) PCT Pub. No.: WO2016/078620
PCT Pub. Date: May 26, 2016

(65) Prior Publication Data
US 2017/0324380 A1    Nov. 9, 2017

(30) Foreign Application Priority Data

Nov. 20, 2014  (CN) .......................... 2014 1 0669957
Nov. 20, 2014  (CN) ................... 2014 2 0700624 U

(51) Int. Cl.
  *H03F 1/02*    (2006.01)
  *H03F 3/193*   (2006.01)
  (Continued)

(52) U.S. Cl.
  CPC ............. *H03F 1/0238* (2013.01); *G05F 1/56* (2013.01); *G05F 1/575* (2013.01); *H03F 1/02* (2013.01);
  (Continued)

(58) Field of Classification Search
  USPC .............................. 330/297–298, 291, 207 P
  See application file for complete search history.

(56) References Cited

U.S. PATENT DOCUMENTS 8,265,574 B2     9/2012  Karnik et al.
8,907,726 B2 *  12/2014  Ortiz .................... H03G 3/3042
                                                          330/285

(Continued)

FOREIGN PATENT DOCUMENTS

CN       2876858         3/2007
CN     102243504        11/2011
(Continued)

OTHER PUBLICATIONS

English abstract translation of CN 102243504.
(Continued)

*Primary Examiner* — Hieu P Nguyen
(74) *Attorney, Agent, or Firm* — WPAT, PC

(57) ABSTRACT

A power control method and device for improving radio-frequency power amplifier (RF PA) switch spectrum, the method comprising the following steps: (a) detecting the gate voltage and drain voltage, or the gate voltage and supply voltage (vdd) of a pass element (105) to obtain the saturation information of the pass element (105); (b) if the saturation information indicates that the pass element (105) is about to leave the saturation working area, shunting the drain current of the pass element (105) to the error amplifier (102) to reduce the drain output voltage, thus reducing the variation of the output voltage, preventing the output voltage
(Continued)

from quickly approaching the supply voltage (vdd), maintaining the saturation of the pass element (105), and improving the switch spectrum characteristics of RF PA.

9 Claims, 4 Drawing Sheets

(51) Int. Cl.
*H03F 3/21* (2006.01)
*G05F 1/575* (2006.01)
*G05F 1/56* (2006.01)
*H03F 3/20* (2006.01)

(52) U.S. Cl.
CPC .............. *H03F 3/193* (2013.01); *H03F 3/20* (2013.01); *H03F 3/21* (2013.01); *H03F 2200/18* (2013.01); *H03F 2200/451* (2013.01)

(56) References Cited

U.S. PATENT DOCUMENTS 9,595,933 B2  3/2017  Zhao et al.
2013/0134952 A1  5/2013  Imura

FOREIGN PATENT DOCUMENTS

CN   102354242   2/2012
CN   104617886   5/2015
CN   204465461   7/2015
WO   2015101146  7/2015

OTHER PUBLICATIONS

English abstract translation of CN 104617886.
English abstract translation of CN 204465461.
English abstract translation of CN 102354242.
English abstract translation of CN 2876858.
English abstract translation of WO 2015101146.

\* cited by examiner

POWER CONTROL METHOD, DEVICE AND COMMUNICATION TERMINAL FOR IMPROVING POWER AMPLIFIER SWITCH SPECTRUM

BACKGROUND

Technical Field

The present invention relates to the field of wireless communications technologies, to a power control method for improving a switch spectrum characteristic of a radio frequency power amplifier, and also to a power control device for implementing the foregoing power control method and a communication terminal including the power control device.

Related Art

A radio frequency power amplifier (RF PA) is widely applied to communication terminals such as mobile phones. In a pre-stage circuit of a transmitter, power of a radio frequency signal generated by a modulation and oscillation circuit is very small, and an RF PA needs to perform a series of amplifications in a buffer stage, an intermediate amplification stage, and a final power amplification stage to obtain a sufficient radio frequency power, so as to feed the power to the antenna to radiate it. In this process, accurate power control is critical to ensuring normal use of a communication terminal.

At present, there are various mobile communications standards or wireless communications standards, such as GSM, TD-LTE, WCDMA, and Wi-Fi, in the market. Accurate power control within a large dynamic range is required in all of the communications standards. An output characteristic of the RF PA needs to comply with relevant communications standards. For example, output power control needs to satisfy a requirement of a burst mask. To satisfy the requirement, a power control circuit is usually provided with a specific circuit to detect a saturation degree, but an implementation method thereof is often too complex.

For example, in an existing power control circuit, the foregoing requirement is satisfied by setting a voltage of a base electrode of a bias power amplifier. A signal of the voltage is formed by linearly combining a power control signal and a reference voltage. Although in a case of a low power, this solution improves power-added efficiency, in a case of a high power, particularly in a case of a high power and a low supply voltage, a phenomenon of switch spectrum degradation is likely to occur in this solution.

The Chinese Patent Application with the Publication No. CN102354242A discloses a power control circuit, which may dynamically adjust a voltage of a base electrode of a power amplifier according to requirements of different output powers, so as to achieve an objective of current optimization. The power control circuit includes an error amplifier, a regulator, and a current detection circuit. The current detection circuit detects a current flowing through the power amplifier, and generates a detection signal. Such a signal may be a voltage or a current. In a specific implementation, the current flowing through the power amplifier may be copied and scaled down according to a proportion. Upon further modulation performed by an input power control signal, the copied current is fed back to the error amplifier. Hence, the error amplifier generates an output voltage to control the base electrode of the power amplifier, thereby achieving an objective of dynamically controlling the voltage of the base electrode so as to optimize the current. However, such a solution also has the following advantage: when a supply voltage of a mobile terminal is excessively low, a switch spectrum characteristic of the power amplifier may still be degraded.

SUMMARY

For the disadvantage of the prior art, the primary technical problem to be resolved by the present invention is to provide a power control method for improving a switch spectrum characteristic of a radio frequency power amplifier.

Another technical problem to be resolved by the present invention is to provide a power control device for implementing the foregoing power control method.

A further technical problem to be resolved by the present invention is to provide a communication terminal including the power control device.

To achieve the foregoing inventive objectives, the following technical solutions are used in the present invention.

A power control method for improving a switch spectrum of a radio frequency power amplifier includes the following steps:

(1) detecting a gate voltage and a drain voltage of a flow-through element or a gate voltage of a flow-through element and a supply voltage, so as to obtain saturation degree information of the flow-through element; and (2) if the saturation degree information shows that the flow-through element is about to depart from a saturated operating region, shunting a drain current of the flow-through element to an error amplifier, so as to lower a drain output voltage.

Preferably, the gate voltage of the flow-through element and the supply voltage are detected; and when a difference between the gate voltage and the supply voltage reaches a set value, a gate electrode of the flow-through element is charged to prevent an excessively low saturation degree.

A power control device for improving a switch spectrum of a radio frequency power amplifier, configured to implement the power control method, includes: a linear voltage regulator circuit and a dynamic current source, where a linear voltage regulator module further includes an error amplifier 102, a feedback circuit 104 and a flow-through element 105, where the error amplifier 102 is an operational amplifier, an out-phase input terminal thereof is connected to a power control signal Vramp provided externally, an in-phase input terminal is connected to one terminal of the feedback circuit 104, and an output terminal 103 is connected to a gate electrode of the flow-through element 105; a source electrode of the flow-through element 105 is connected to a power supply terminal Vdd, and a drain electrode 106 is connected to the other terminal of the feedback circuit; the other terminal of the feedback circuit 104 is connected to the gate electrode of the flow-through element 105;

the dynamic current source 201 includes three terminals, where a first terminal 2011 is connected to the output terminal 103 of the error amplifier 102, a second terminal 2012 is connected to the in-phase input terminal of the error amplifier 102, and a third terminal 2013 is connected to a drain electrode of the flow-through element 105 or the power supply terminal (Vdd).

Preferably, when the power control signal Vramp is relatively low or the supply voltage Vdd is relatively high, the dynamic current source 201 does not work; and when the power control signal Vramp gradually increases to be higher than a set value or the supply voltage Vdd is decreased to the set value, that is, when the gate electrode of the flow-through element 105 is decreased to the set value, the dynamic current source 201 is conducted to work.

Preferably, the dynamic current source 201 is constituted by a PMOS transistor 202 and an NMOS transistor 203; a gate electrode of the PMOS transistor 202 is connected to the output terminal 103 of the error amplifier 102, a drain electrode is connected to the in-phase input terminal of the error amplifier 102, and a source electrode is connected to the drain electrode of the flow-through element 105; a gate electrode and a source electrode of the NMOS transistor 203 are connected to each other, and are further connected to the drain electrode of the flow-through element 105, and a drain electrode of the NMOS transistor 203 is connected to the in-phase input terminal of the error amplifier 102.

Preferably, the dynamic current source 201 is constituted by a first PMOS transistor 202, a second PMOS transistor 204, and an NMOS transistor 203; a gate electrode of the first PMOS transistor 202 is connected to the output terminal 103 of the error amplifier 102, a drain electrode is connected to the in-phase input terminal of the error amplifier 102, and a source electrode is connected to a gate electrode and a source electrode of the NMOS transistor 203, and is further connected to a drain electrode of the second PMOS transistor 204; a drain electrode of the NMOS transistor 203 is connected to the in-phase input terminal of the error amplifier 102; a gate electrode of the PMOS transistor 204 is connected to the gate electrode of the flow-through element 105, and a source electrode is connected to the source electrode of the flow-through element 105.

Preferably, one terminal of a dynamic clamper 301 is connected to the power supply terminal Vdd; and the other terminal is connected to the output terminal 103 of the error amplifier 102.

Preferably, when the power control signal Vramp is relatively small, a voltage of the output terminal 103 of the error amplifier 102 is relatively high and the dynamic clamper 301 does not work; when the power control signal Vramp exceeds the set value, the voltage of the output terminal 103 of the error amplifier 102 is decreased, and a current flows through the dynamic clamper 301, so as to charge the gate electrode of the flow-through element 105 to prevent the voltage from being excessively decreased.

Preferably, the dynamic clamper 301 may be constituted by one or more PMOS transistors connected in series, where a gate electrode of each PMOS transistor is connected to a drain electrode thereof, and a drain electrode of a PMOS transistor is connected to a source electrode of a next PMOS transistor; and a source electrode of a first PMOS transistor is connected to the power supply terminal Vdd, a drain electrode is connected to a source electrode of another PMOS transistor, and so forth, and a drain electrode of a last PMOS transistor is connected to the output terminal 103 of the error amplifier 102.

A communication terminal with a radio frequency power amplifier is provided, where the communication terminal includes any one of the foregoing power control devices.

As compared with the prior art, the present invention uses simple but ingenious circuit design, so as to decrease a change rate of an output voltage, prevent the output voltage from quickly approaching a supply voltage, maintain a saturation degree of a flow-through element, and significantly improve a switch spectrum characteristic of a radio frequency power amplifier. The present invention is particularly suitable for use in a case of a low supply voltage.

DETAILED DESCRIPTION

The technical content of the present invention is further described below with reference to the accompanying drawings and the specific embodiments.

Figure 1:
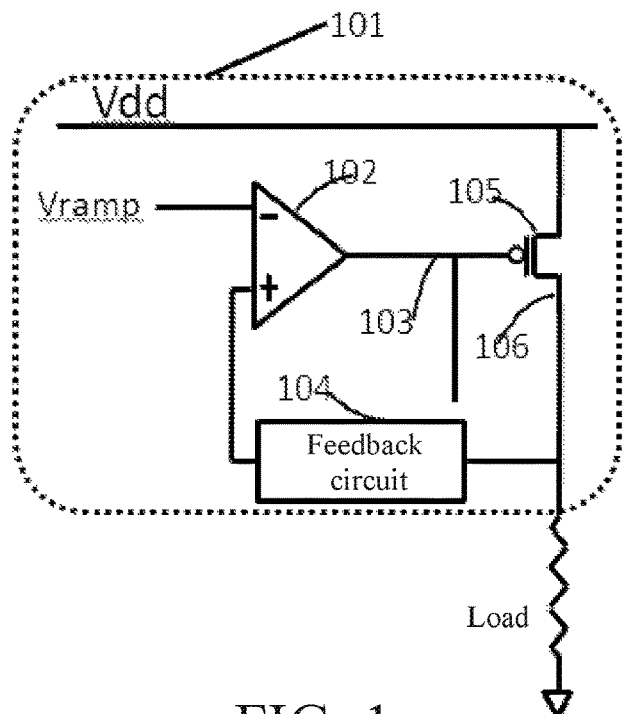
FIG. 1 is a schematic diagram of a linear voltage regulator circuit for implementing the present invention.

As shown in FIG. 1, a linear voltage regulator circuit 101 for implementing the present invention includes an error amplifier 102, a feedback circuit 104, and a flow-through element 105. The error amplifier 102 is an operational amplifier, an out-phase input terminal thereof is connected to a power control signal Vramp provided externally, an in-phase input terminal is connected to one terminal of the feedback circuit 104, and an output terminal 103 is connected to a gate electrode of the flow-through element 105. A source electrode of the flow-through element 105 is connected to a power supply terminal Vdd, and a drain electrode 106 is connected to the other terminal of the feedback circuit and is also connected to a collector electrode or collector electrodes of one or more radio frequency power amplifiers, indicated by a load in FIG. 1. The linear voltage regulator circuit 101 includes two outputs: one is a drain electrode 106 of the flow-through element 105, at which a voltage is Vcc; and the other one is the output terminal 103 of the error amplifier. Because of a negative feedback characteristic of the linear voltage regulator circuit 101, the voltage Vcc at the drain electrode 106 of the flow-through element 105 responds to the power control signal Vramp. An output voltage Vcc of the linear voltage regulator circuit 101 linearly responds to the power control signal Vramp to control a collector electrode of a radio frequency power amplifier, indicated by a load in FIG. 1 to FIG. 4. The flow-through element 105 is usually a PMOS transistor. Similarly, the PMOS transistor may also be replaced with an NMOS transistor, and then slight adjustment is performed.

It is generally known that the PMOS transistor that serves as the flow-through element usually has two operating states: a linear operating region and a saturated operating region. When the power control signal is relatively small, the PMOS transistor is in the saturated operating region. In this case, the entire linear voltage regulator circuit has a relatively great operating bandwidth, and has a strong voltage stabilizing function. When the power control signal is increased, the PMOS transistor gradually departs from the saturated operating region to enter a linear region. In this case, a bandwidth of a system is narrowed, and the voltage stabilizing function is weakened. The PMOS being in which operating state may be determined by a relative value of a voltage at each port of the PMOS transistor. Specifically, if $$V_{sg} < V_{sd} + |V_{tp}| \qquad (1),$$

the PMOS transistor is in a saturated region. Otherwise, the PMOS transistor is in the linear region. Herein, Vsg is a difference between a source voltage and a gate voltage of the PMOS transistor, and the Vsd is a difference between the source voltage and a drain voltage. Vtp is a threshold voltage of the PMOS transistor. When the power control signal is very great, the Vsg is far greater than Vsd+|Vtp|, and the PMOS transistor is in a deep linear region, a saturation degree thereof is very small and a switch spectrum characteristic are poor.

In the linear voltage regulator circuit, a saturation degree of the flow-through element 105 is crucial to a switch spectrum characteristic of the radio frequency power amplifier. Therefore, if the saturation degree thereof is smaller, the switch spectrum characteristic of the radio frequency power amplifier is worse. Therefore, a dynamic current source and a dynamic clamper are introduced in the present invention to improve performance of a switch spectrum at a low supply voltage.

Figure 2:
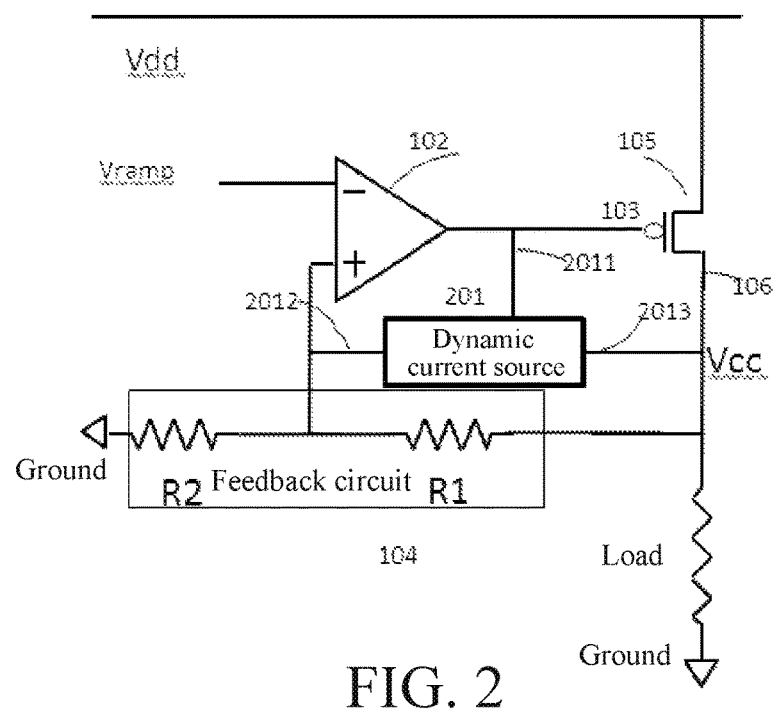
FIG. 2 is a schematic diagram of a power control device for improving a switch spectrum characteristic of a radio frequency power amplifier in an embodiment of the present invention.

FIG. 2 shows a power control device for improving a switch spectrum of a radio frequency power amplifier according to the present invention. The power control device includes a linear voltage regulator circuit 101 and a dynamic current source 201. The dynamic current source 201 includes three terminals, where a first terminal 2011 is connected to an output terminal 103 of an error amplifier 102, a second terminal 2012 is connected to an in-phase input terminal of the error amplifier 102, and a third terminal 2013 is connected to a drain electrode 106 of a flow-through element 105 or a power supply terminal. An effect of the dynamic current source 201 is that: when a gate voltage of the flow-through element 105 is decreased, a high current flows through a drain electrode 106 of the flow-through element 105, and in this case, a voltage Vcc becomes higher, resulting in rising of the voltage Vcc, for the entire circuit system, high-frequency noise may be increased in a radio frequency switch spectrum; when the first terminal 2011 of the dynamic current source 201 detects that a voltage of the output terminal 103 of the error amplifier 102 is instantaneously decreased, and in this case, the dynamic current source 201 is conducted to shunt the large current of the drain electrode 106 of the flow-through element 105, and a current flowing through a resistor R1 becomes smaller, so that the voltage Vcc is decreased. That is, a transient change is alleviated, so as to improve a change rate of the current or voltage, thereby lowering the high-frequency noise. That is, an objective of decreasing a change rate of the voltage Vcc when the voltage Vcc approaches a supply voltage Vdd is achieved.

Figure 3:
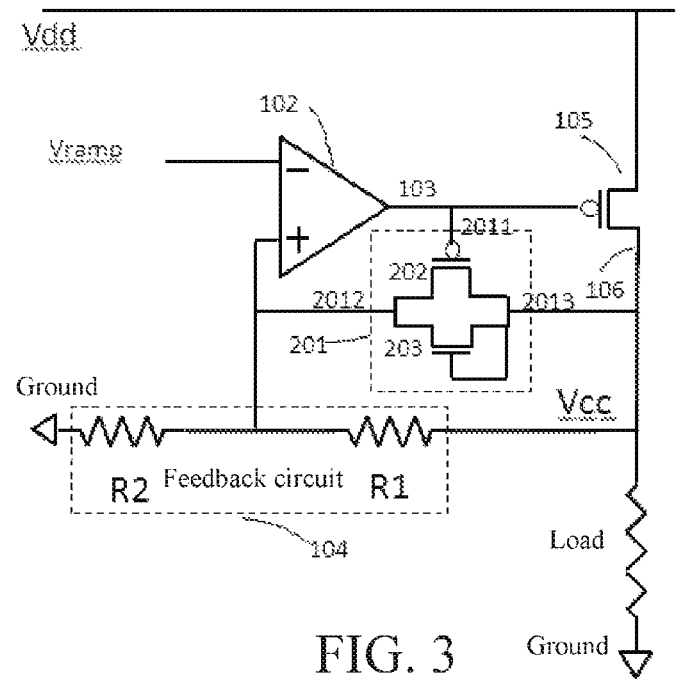
FIG. 3 is a schematic diagram of a power control device using a dynamic current source of a first type in an embodiment of the present invention.

The dynamic current source may have several implementations. With reference to FIG. 3, in a first implementation, the dynamic current source is constituted by a PMOS transistor 202 and an NMOS transistor 203. A gate electrode of the PMOS transistor 202 is connected to the output terminal 103 of the error amplifier 102, a drain electrode is connected to the in-phase input terminal of the error amplifier 102, and a source electrode is connected to a drain electrode of the flow-through element 105. A gate electrode and a source electrode of the NMOS transistor 203 are connected to each other, and are further connected to the drain electrode of the flow-through element 105, and a drain electrode of the NMOS transistor 203 is connected to the in-phase input terminal of the error amplifier 102.

When the power control signal is relatively small, the gate voltage of the flow-through element 105 is relatively high. In this case, a small current flows through the drain electrode, that is, an output voltage Vcc is relatively low. The PMOS transistor 202 and the NMOS transistor are not conducted. Because a gate voltage of the PMOS transistor is relatively high, there is a relatively small current flowing through the PMOS transistor. The NMOS transistor also has a small current flowing therethrough because the voltage is relatively low. That is, the dynamic current source 201 has a small current flowing therethrough. However, normal operation of other circuits is not affected. That is, when the Vramp is relatively small, the dynamic current source is not conducted. This circuit does not affect the normal operation of other circuits. When the Vramp exceeds a threshold value, the dynamic current source is conducted, and a current begins to flow through. In a process in which the power control signal is gradually increased, the gate voltage of the flow-through element 105 is gradually decreased, and the current flowing through the drain electrode is also gradually increased. That is, the output voltage Vcc is gradually increased. When the flow-through element 105 is about to depart from the saturated region, the switch spectrum thereof may be degraded. In this case, a gate voltage of the PMOS transistor 202 is relatively low, and when the gate voltage reaches a design value, the PMOS transistor 202 starts to work, the output voltage Vcc is also high, and there is a large current flowing through the PMOS transistor 202. When a gate voltage of the NMOS transistor 203 is relatively high, and the drain voltage, that is, the output voltage Vcc, is also relatively high, so that a relatively great current will passes through the NMOS transistor 203 when the NMOS transistor 203 starts to work. Because Vcc=Vramp*R1/R2+Vramp*R2/R2, that is, the output voltage Vcc is equal to a sum of the voltage Vramp of resistor R1*R1/R2 and a voltage Vramp of the resistor R2*R2/R2, when the dynamic current source 201 works, because of a shunting function of the dynamic current source 201, a current flowing through the resistor R1 is smaller than a current flowing through the resistor R2, so that the output voltage Vcc becomes smaller. That is, the dynamic current source 201 may decrease a change rate of the output voltage Vcc, prevent the output voltage Vcc from quickly approaching the supply voltage Vdd, maintain a saturation degree of the flow-through element 105, and to some extent, alleviate degradation of the switch spectrum of the radio frequency power amplifier.

Figure 4:
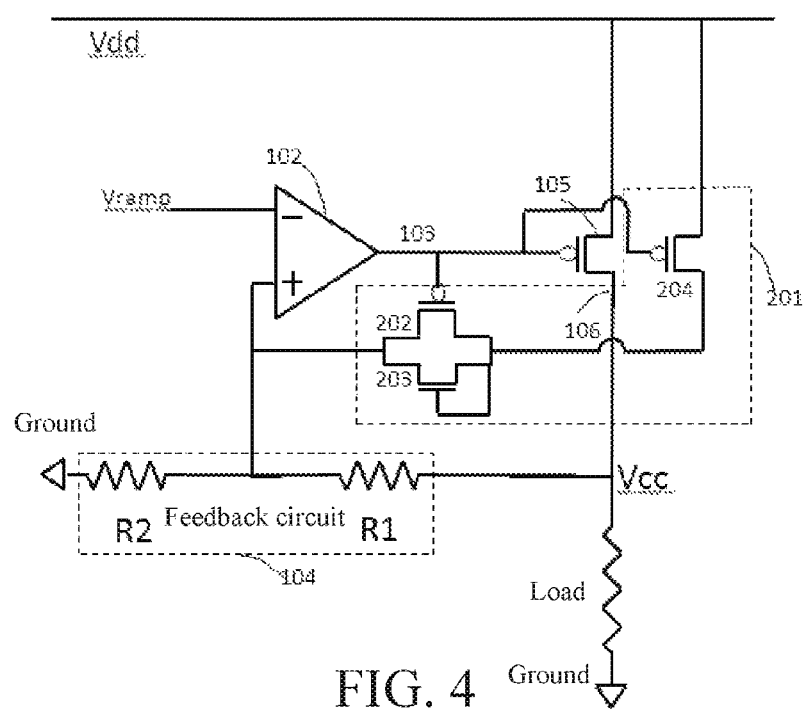
FIG. 4 is a schematic diagram of a power control device using a dynamic current source of a second type in an embodiment of the present invention.

With reference to FIG. 4, in a second implementation, the dynamic current source is constituted by the PMOS transistor 202, a PMOS transistor 204, and the NMOS transistor 203. The gate electrode of the PMOS transistor 202 is connected to the output terminal 103 of the error amplifier 102, the drain electrode is connected to the in-phase input terminal of the error amplifier 102, and the source electrode is connected to the gate electrode and the source electrode of the NMOS transistor 203, and is further connected to a drain electrode of the PMOS transistor 204. The drain electrode of the NMOS transistor 203 is connected to the in-phase input terminal of the error amplifier 102. A gate electrode of the PMOS transistor 204 is connected to the gate electrode of the flow-through element 105, and a source electrode is connected to the source electrode of the flow-through element 105, and may also be connected to the power supply terminal.

A PMOS transistor 204 is added in the second implementation on the basis of the first implementation. When a gate voltage of the PMOS transistor 204 is relatively low and the supply voltage Vdd is also relatively low, a relatively great current flows through the PMOS transistor 204, so that the PMOS transistor 202 and NMOS transistor 203 also work at the same time. A main function of the PMOS transistor 204 is detecting a situation in which the supply voltage Vdd becomes lower but the power control signal Vramp is relatively great, and then triggering the PMOS transistor 202 and NMOS transistor 203 to work. Other operation processes are the same as those in the first implementation, and are not specifically described herein.

Figure 5:
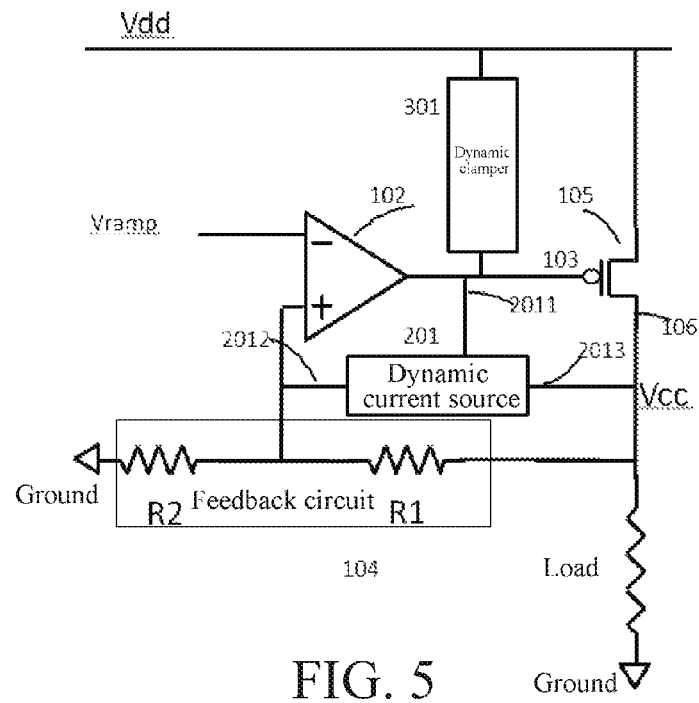
FIG. 5 is a schematic diagram of a power control device added with a dynamic clamper on the basis of FIG. 2.

To further optimize the implementation effects of this power control device, the present invention further provides a dynamic clamper, referring to FIG. 5. One terminal of the dynamic clamper 301 is connected to the power supply terminal. That is, one terminal of the dynamic clamper 301 is the supply voltage Vdd. The other terminal of the dynamic clamper 301 is connected to the output terminal 103 of the error amplifier 102. A function of the dynamic clamper 301 is: preventing the gate voltage of the flow-through element 105 from becoming too low instantaneously, and to some extent, alleviating impacts brought by the power control signal Vramp becoming greater instantaneously.

Figure 6:
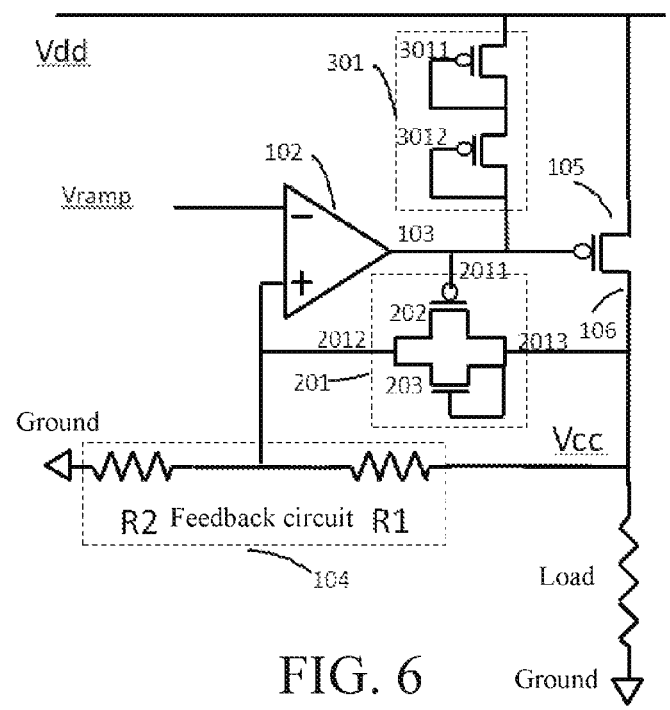
FIG. 6 is a schematic diagram of a power control device added with a dynamic clamper on the basis of FIG. 3.
Figure 7:
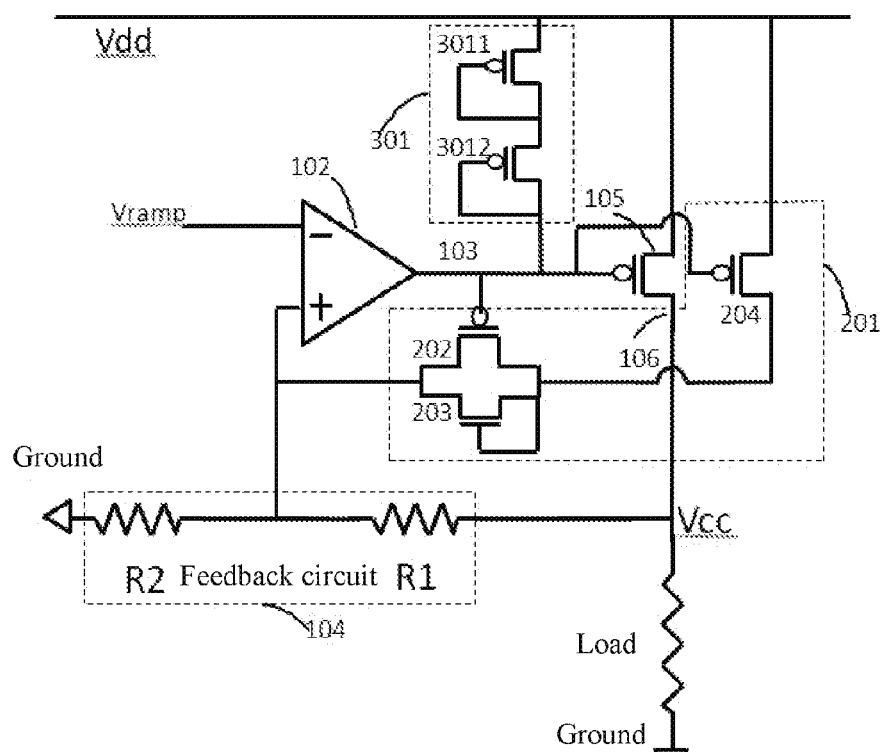
FIG. 7 is a schematic diagram of a power control device added with a dynamic clamper on the basis of FIG. 4.

The dynamic clamper 301 may be constituted by one or more PMOS transistors, where a gate electrode of each transistor is connected to a drain electrode thereof, and multiple PMOS transistors are connected in series. Moreover, a source electrode of a first PMOS transistor is connected to the supply voltage Vdd, and a drain electrode of a last PMOS transistor is connected to the output terminal 103 of the error amplifier 102. With reference to FIG. 6 and FIG. 7, in an embodiment of the present invention, the dynamic clamper 301 includes two PMOS transistors: a PMOS transistor 3011 and a PMOS transistor 3012. Gate electrodes of the PMOS transistor 3011 and the PMOS transistor 3012 are connected to respective drain electrodes thereof. A source electrode of the PMOS transistor 3011 is connected to the power supply terminal, where a voltage thereof is the supply voltage Vdd. A drain electrode of the PMOS transistor 3011 is connected to a source electrode of the PMOS transistor 3012. A drain electrode of the PMOS transistor 3012 is connected to the output terminal 103 of the error amplifier 102.

When the power control signal Vramp is relatively small, the voltage of the output terminal 103 of the error amplifier 102 is relatively high, and the dynamic clamper 201 does not produce an effect. Therefore, functions of a basic circuit are not affected. When the power control signal Vramp is relatively great, the voltage of the output terminal 103 of the error amplifier 102 is decreased, so that there is a current flowing through the dynamic clamper 201 to charge the gate electrode of the flow-through element 105, so as to prevent the voltage from being excessively decreased.

The power control device shown in the foregoing embodiments may be used in a chip. Specific structures of the power control device in the chip are not described herein in detail.

In addition, the foregoing power control device may further be used in a communication terminal to serve as an important component of a radio frequency circuit. The communication terminal herein refers to a computer device that can be used in a mobile environment and that supports various communications standards such as GSM, EDGE, TD_SCDMA, TDD_LTE, and FDD_LTE, and includes, but is not limited to a mobile phone, a notebook computer, a tablet computer, and a vehicle-mounted computer. In addition, the power control method and the power control device are also suitable for other application scenarios of radio frequency power amplifiers, for example, a communications base station compatible with multiple communications standards.

The above describes in detail the power control method and device for improving a switch spectrum of a power amplifier and the communication terminal provided in the present invention. For persons of ordinary skill in the art, any obvious modifications made to the present invention without departing from the substantial spirit of the present invention constitute infringement to a patent right of the present invention, and corresponding bear legal liabilities should be borne.

What is claimed is:

1. A power control device for improving a switch spectrum of a radio frequency power amplifier, comprising: a linear voltage regulator circuit and a dynamic current source, wherein the linear voltage regulator circuit further comprises an error amplifier (102), a feedback circuit (104) and a flow-through element (105), wherein
   an out-phase input terminal of the error amplifier (102) is connected to a power control signal (Vramp) provided externally, an in-phase input terminal is connected to one terminal of the feedback circuit (104), and an output terminal (103) is connected to a gate electrode of the flow-through element (105); a source electrode of the flow-through element (105) is connected to a power supply terminal (Vdd), and a drain electrode (106) is connected to the other terminal of the feedback circuit; the other terminal of the feedback circuit (104) is connected to the gate electrode of the flow-through element (105);
   the dynamic current source (201) comprises three terminals, wherein a first terminal (2011) is connected to the output terminal (103) of the error amplifier (102), a second terminal (2012) is connected to the in-phase input terminal of the error amplifier (102), and a third terminal (2013) is connected to a drain electrode of the flow-through element (105) or the power supply terminal (Vdd);
   the dynamic current source (201) is constituted by a first PMOS transistor (202), a second PMOS transistor (204), and an NMOS transistor (203); a gate electrode of the first PMOS transistor (202) is connected to the output terminal (103) of the error amplifier (102), a drain electrode is connected to the in-phase input terminal of the error amplifier (102), and a source electrode is connected to a gate electrode and a source electrode of the NMOS transistor (203), and is further connected to a drain electrode of the second PMOS transistor (204); a drain electrode of the NMOS transistor (203) is connected to the in-phase input terminal of the error amplifier (102); a gate electrode of the PMOS transistor (204) is connected to the gate electrode of the flow-through element (105), and a source electrode is connected to the source electrode of the flow-through element (105).

2. The power control device according to claim 1, wherein:
   when the power control signal (Vramp) is relatively low or the supply voltage (Vdd) is relatively high, the dynamic current source (201) does not work; and when the power control signal (Vramp) gradually increases to be higher than a set value or the supply voltage (Vdd) is decreased to the set value, that is, when the gate electrode of the flow-through element (105) is decreased to the set value, the dynamic current source (201) is conducted to work.

3. The power control device according to claim 2, wherein:
   the dynamic current source (201) is constituted by a PMOS transistor (202) and an NMOS transistor (203); a gate electrode of the PMOS transistor (202) is connected to the output terminal (103) of the error amplifier (102), a drain electrode is connected to the in-phase input terminal of the error amplifier (102), and a source electrode is connected to the drain electrode of the flow-through element (105); a gate electrode and a source electrode of the NMOS transistor (203) are connected to each other, and are further connected to the drain electrode of the flow-through element (105), and a drain electrode of the NMOS transistor (203) is connected to the in-phase input terminal of the error amplifier (102).

4. The power control device according to claim 1, further comprising a dynamic damper (301), wherein
one terminal of the dynamic damper (301) is connected to the power supply terminal (Vdd); and the other terminal is connected to the output terminal (103) of the error amplifier (102).

5. The power control device according to claim 4, wherein when the power control signal (Vramp) is relatively small, a voltage of the output terminal (103) of the error amplifier (102) is relatively high, and the dynamic damper (301) does not work; when the power control signal (Vramp) exceeds the set value, the voltage of the output terminal (103) of the error amplifier (102) is decreased, and a current flows through the dynamic damper (301), so as to charge the gate electrode of the flow-through element (105) to prevent the voltage from being excessively decreased.

6. The power control device according to claim 4, wherein the dynamic clamper (301) is constituted by one or more PMOS transistors connected in series, wherein a gate electrode of each PMOS transistor is connected to a drain electrode thereof; and
a source electrode of a first PMOS transistor is connected to the power supply terminal (Vdd), a drain electrode is connected to a source electrode of a next PMOS transistor, and so forth, and a drain electrode of a last PMOS transistor is connected to the output terminal (103) of the error amplifier (102).

7. A communication terminal with a radio frequency power amplifier, wherein the communication terminal comprises the power control device according to claim 1.

8. A power control method for improving a switch spectrum of a radio frequency power amplifier, implemented by the power control device according to claim 1, comprising the following steps:
(1) detecting a gate voltage and a drain voltage of a flow-through element (105) or a gate voltage of a flow-through element (105) and a supply voltage, so as to obtain saturation degree information of the flow-through element (105); and
(2) if the saturation degree information shows that the flow-through element (105) is about to depart from a saturated operating region, shunting a drain current of the flow-through element (105) to an error amplifier (102), so as to lower a drain output voltage.

9. The power control method according to claim 8, further comprising the following steps:
detecting the gate voltage of the flow-through element (105) and the supply voltage; and
when a difference between the gate voltage and the supply voltage reaches a set value, charging a gate electrode of the flow-through element (105) to prevent an excessively low saturation degree.

* * * * *